(12) United States Patent
Hoepken et al.

(10) Patent No.: US 7,520,426 B2
(45) Date of Patent: Apr. 21, 2009

(54) POSITION MONITORING DEVICE

(75) Inventors: Hermann Hoepken, Sprockhovel (DE); Christoph Stratmann, Essen (DE)

(73) Assignee: K.A. Schmersal Holding KG, Wuppertal (DE)

( * ) Notice: Subject to any disclaimer, the term of this patent is extended or adjusted under 35 U.S.C. 154(b) by 468 days.

(21) Appl. No.: 11/221,330

(22) Filed: Sep. 6, 2005

(65) Prior Publication Data

US 2006/0071787 A1 Apr. 6, 2006

(30) Foreign Application Priority Data

Sep. 20, 2004 (DE) .................. 10 2004 045 909
Oct. 5, 2004 (DE) .................. 10 2004 049 024

(51) Int. Cl.
*G06K 5/00* (2006.01)

(52) U.S. Cl. .................. 235/382; 235/435; 235/449; 340/539.23

(58) Field of Classification Search .................. 235/382, 235/382.5, 435, 439, 449, 436; 340/539.23
See application file for complete search history.

(56) References Cited

U.S. PATENT DOCUMENTS

| 6,259,352 B1 * | 7/2001 | Yulkowski et al. ........... 340/5.7 |
| 6,450,404 B1 * | 9/2002 | Imazuka ..................... 235/381 |
| 2006/0220846 A1 * | 10/2006 | Stratmann ............... 340/545.2 |

FOREIGN PATENT DOCUMENTS

| DE | 19711588 A1 | 9/1998 |
| DE | 19928641 C1 | 5/2001 |
| DE | 10230564 A1 | 1/2004 |
| DE | 10348884 A1 | 5/2005 |
| GB | 1452132 | 10/1976 |
| GB | 2354557 A | 9/1999 |
| JP | 63014541 | 1/1989 |
| JP | 11191666 | 1/2001 |
| WO | WO03/052455 | 6/2003 |

* cited by examiner

*Primary Examiner*—Seung H Lee
(74) *Attorney, Agent, or Firm*—Townsend and Townsend and Crew LLP

(57) ABSTRACT

The invention relates to a position monitoring device for establishing the position of a first part with respect to a second part, having a transceiver at the first part for emitting an interrogation signal and for receiving a response signal that can be emitted in reaction to the interrogation signal by a transponder, wherein a screen that attenuates signals between the transponder and the transceiver is provided, two members of the group consisting of the transceiver, the screen and the transponder being movable relative to one another.

16 Claims, 2 Drawing Sheets

POSITION MONITORING DEVICE

FIELD OF THE INVENTION

The invention relates to a position monitoring device as may be used for detecting a closed position of a door, a flap or the like or the standstill or rotation of rotational piece of machine tool or the telescoping position of an arm.

DESCRIPTION OF THE RELATED ART

Known position switches, cf. for example DE 199 53 898 A1, DE 199 28 641 C1, DE 197 11 588 A1, DE 102 30 564 A1 or EP 0 987 726 A2, serve in particular for monitoring the closed position of access protection devices for machines or mechanical installations with hazard potential, for example a flap in the lining of a meat dicing machine or an access gate in fencing of a section of a production line having processing robots. Typically, the machine or mechanical installation is switched off when the access protection device is opened, and a renewed switch-on is prevented until the access protection device is closed again. For this purpose, a transponder is fitted to a closing part of the access protection device, e.g the flap or gate, which transponder can be identified by a transceiver at a part that can be closed off, e.g. the lining or fencing, if the distance between transponder and transceiver falls below a closed position limiting distance. In this case, it must be ensured by exact mounting of the transponder and transceiver that the closed position limiting distance is undershot only when the access protection device is completely closed. An adjustment that may be required after mounting requires an offset of the transponder and/or of the transceiver. Moreover, under confined space conditions it is not always possible to mount the transceiver and transponder at the required distance relative to one another. This may have the effect that when the access protection device is in a slightly open position, a completely closed position is signaled and the machine is not switched off.

SUMMARY OF THE INVENTION

Therefore, the invention is based on the object of providing a position monitoring device that is more secure.

This object is achieved in accordance with the features of Claim 1.

In the case of a position monitoring device for establishing the position of a first part with respect to a second part, said device having a transceiver at the first part for emitting an interrogation signal and for receiving a response signal that can be emitted in reaction to the interrogation signal by a transponder, a screen that attenuates signals between the transponder and the transceiver is therefore provided, two members of the group consisting of the transceiver, the screen and the transponder being movable relative to one another. This makes it possible to achieve a secure positional assignment of the part that is respectively movable relative to the other part since a specific, precisely adjusted positioning is not required.

By virtue of the fact that the screen that can be adjusted between positions having a different screening strength in each case for the transponder or the transceiver can attenuate signals between the transponder and the transceiver, the position limiting distance, that is to say the limiting distance between a first and a second position of two parts that are movable relative to one another, can be set, in a simple manner, between zero and a maximum value prescribed by the transmission/reception power. In addition to the increased security on account of the capability of precisely setting the position limiting distance, the mounting of the transponder and of the transceiver is also simplified since a specific distance does not have to be taken into consideration.

The position monitoring device may expediently be designed in the form of a position switch and is suitable for monitoring the closed position of an access protection device or generally for monitoring whether or not a first part is adjacent to a second part, for example a first part is retracted or extended relative to a second part, and in particular for establishing the closed position of a closing part with respect to a part that can be closed off of an access protection device for a machine or mechanical installation with hazard potential.

Further objects, advantages and embodiments of the invention can be gathered from the description below.

BRIEF DESCRIPTION OF THE DRAWINGS

The invention is explained in more detail below on the basis of exemplary embodiments illustrated in the accompanying figures.

DESCRIPTION OF PREFERRED EMBODIMENTS

Figure 1:
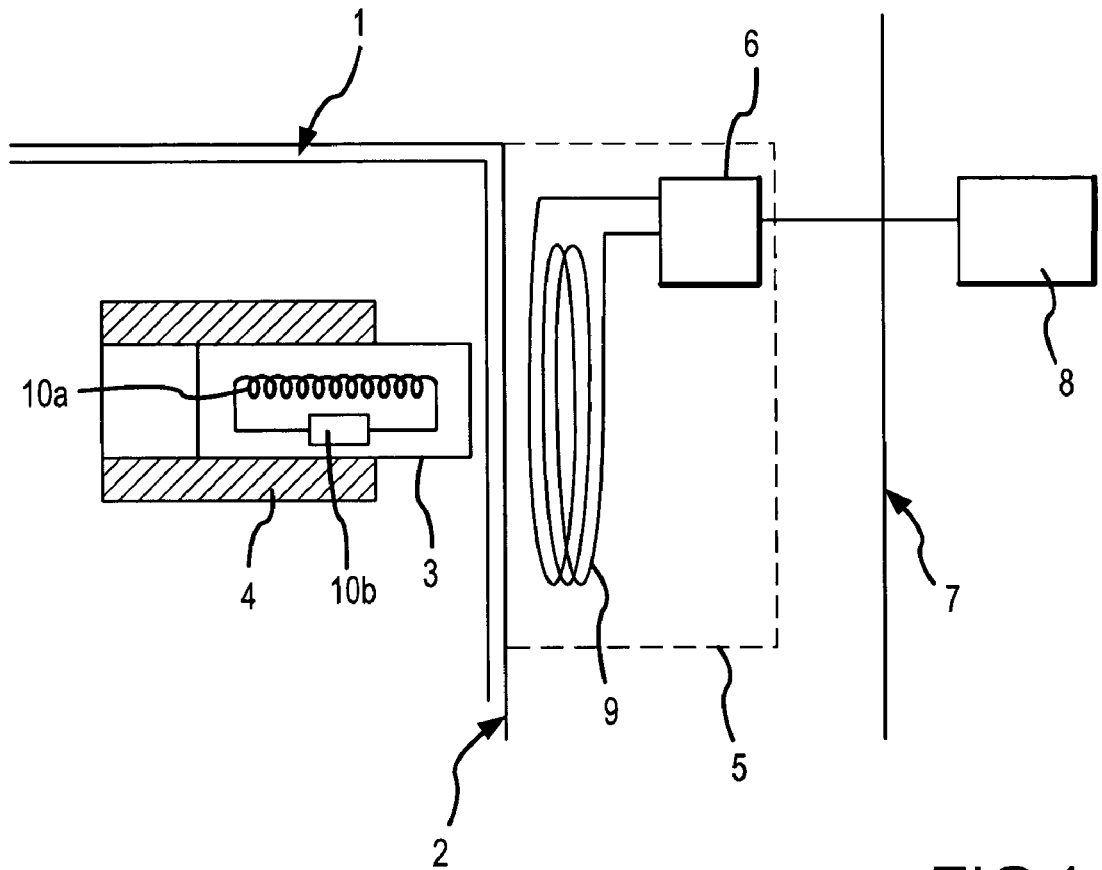
FIG. 1 schematically shows a first exemplary embodiment of a position monitoring device in the form of a position switch.

The position switch—illustrated in FIG. 1—for establishing the closed position of a closing part 1 in the form of a sliding or swiveling gate or flap or the like with respect to a part 2 that can be closed off in the form of a gate opening or access opening in a machine lining, machine fencing or the like comprises a transponder 3—fitted to the closing part 1—with a screen 4 and also a transceiver 5—which is fitted in a stationary manner to the part 2 that can be closed off and which is preferably accommodated in a housing—with a control logic 6 coupled via a direct wire-based or wire-free connection or via a bus 7, for example a two-wire bus for the voltage supply and signal transmission, to a machine controller 8 for the control of the capability of switching on and the switching off of a machine with hazard potential in a manner dependent on the closed position of the closing part 1.

The control logic 6, which is supplied with power via the bus 7, a separate terminal, a battery or the like, excites a coil 9 of the transceiver 5, in particular an air-core coil, preferably periodically to emit interrogation signals. The interrogation signals are electromagnetic waves radiated over a period of time. The electromagnetic waves may have a constant or varying frequency and/or be marked, for example contain information bits in amplitude- or frequency-modulated fashion.

The interrogation signals are received by a coil 10$a$ coupled to a transponder IC 10$b$, for instance a bar-type coil, in the transponder 3. The received energy expediently supplies the operating energy for the transponder 3, which, however, may also be supplied with power via the bus 7, a separate terminal, a battery or the like. In reaction to the interrogation signals, the transponder 3 emits response signals expediently via the same coil 10$a$ or, if appropriate, a further coil. In the simplest case, said response signals may have a specific frequency or be marked in some other way, in particular contain information bits, e.g a unique transponder identifier. The response signals may additionally depend on the received information bits; by way of example, a key may be stored in the transponder 3, by means of which key received information bits are encrypted and subsequently sent back.

The response signals are expediently received by means of the coil 9 or, if appropriate, a further coil in the transceiver 5 and can be evaluated by the control logic 6. By way of example, the control logic 6 can evaluate the frequency of the response signals or the marking thereof and thus establish whether, in particular, a specific transponder 3 is present. In this case, the completely closed state is identified and provided to the machine controller 8, in particular transmitted to the latter or kept ready for being called up. If no or not the correct transponder 3 is established, the open closed state is identified and provided to the machine controller 8. In a further embodiment, the received signals can be evaluated in the machine controller 8, in which case the control logic 6 can be omitted.

The closed position limiting distance is set by means of the screen 4, which can be adjusted, in particular in a continuously variable manner, between positions having different degrees of attenuation of the signals that propagate between the transceiver 5 and the transponder 3 and which can be fixed, in particular fixedly screwed or fixedly clamped, at least in two positions, but preferably in all or in a plurality of positions, relative to the transponder 3. The screen 4 may in this case be, as illustrated, a metal sleeve into which the transponder 3 can be inserted and which forms a mount for the transponder 3. In the inserted position, the screen 4 completely covers the coil 10a, thereby achieving a maximum possible attenuation. The closed position limiting distance is the smallest in this position, that is to say that the transponder 3 has to be very near to the transceiver 5 in order that the position switch signals a completely closed state. If the transponder 3 is not inserted into the screen 4, the attenuation is the least and the closed position limiting distance is the largest, that is to say that the completely closed position is signaled even when there is a large distance between transponder 3 and transceiver 5. If the transponder 3 is only partially inserted into the screen 4, the attenuation and thus the closed position limiting distance lies between the two extreme values.

In the course of mounting the position switch, therefore, firstly the transponder 3 together with the screen 4 is mounted on the closing part 1 and the transceiver 5 is mounted on the part 2 that can be closed off, or vice versa, at an arbitrary distance, e.g. the transponder 3 adjacent to the edge on a gate and the transceiver on a gate frame, so that transponder 3 and transceiver 5 are adjacent to one another in the closed state of the gate. The transponder 3, together with the screen 4, may also project from the surface of the gate, for example in the form of a pin or as part of a mechanical blocking device with an opening for a bolt, in which case a corresponding cutout may then be provided in the transceiver 5 and extend in particular through the interior of the coil 9, into which at least part of the transponder 3 together with screen 4 engages in the closed state of the access protection device.

Afterwards, the closed position limiting distance is set by displacing the screen 4 with regard to the transponder 3 or the transponder 3 with regard to the screen 4 such that it is possible to reliably distinguish the completely closed state from the open closed state of the access protection device.

Instead of being a metal sleeve, the screen 4 may also be formed as a metal sheet or a grid or some other structure which, in an attenuating position, covers at least part of the coil 10a of the transponder 3. The screen 4 may additionally or alternatively also be provided on the transceiver 5.

In the embodiment with a transponder 3 engaging into the interior of the coil 9, the screen 4 may be an inner sleeve which can be inserted into the coil 9 and which, if appropriate, has an axially varying attenuation power and, for this purpose, is thicker for example at one end than at the other end.

If it is assumed in connection with FIG. 1 that part 1 is movable vertically to the paper plane, by positioning the screen 4 it is possible to adjust the lateral displacement at which the transponder 3 is still within the reading area of the transceiver 5. Accordingly it is also possible to adjust the duration interval of the transponder 3 within the reading area and thus the detection time of the transponder 3. In the case part 1 with the transponder 3 is rotating relative to part 2, it is possible to adjust the minimum and maximum rotational speed at which the transponder 3 is still detected by the position of the screen 4.

Figure 2:
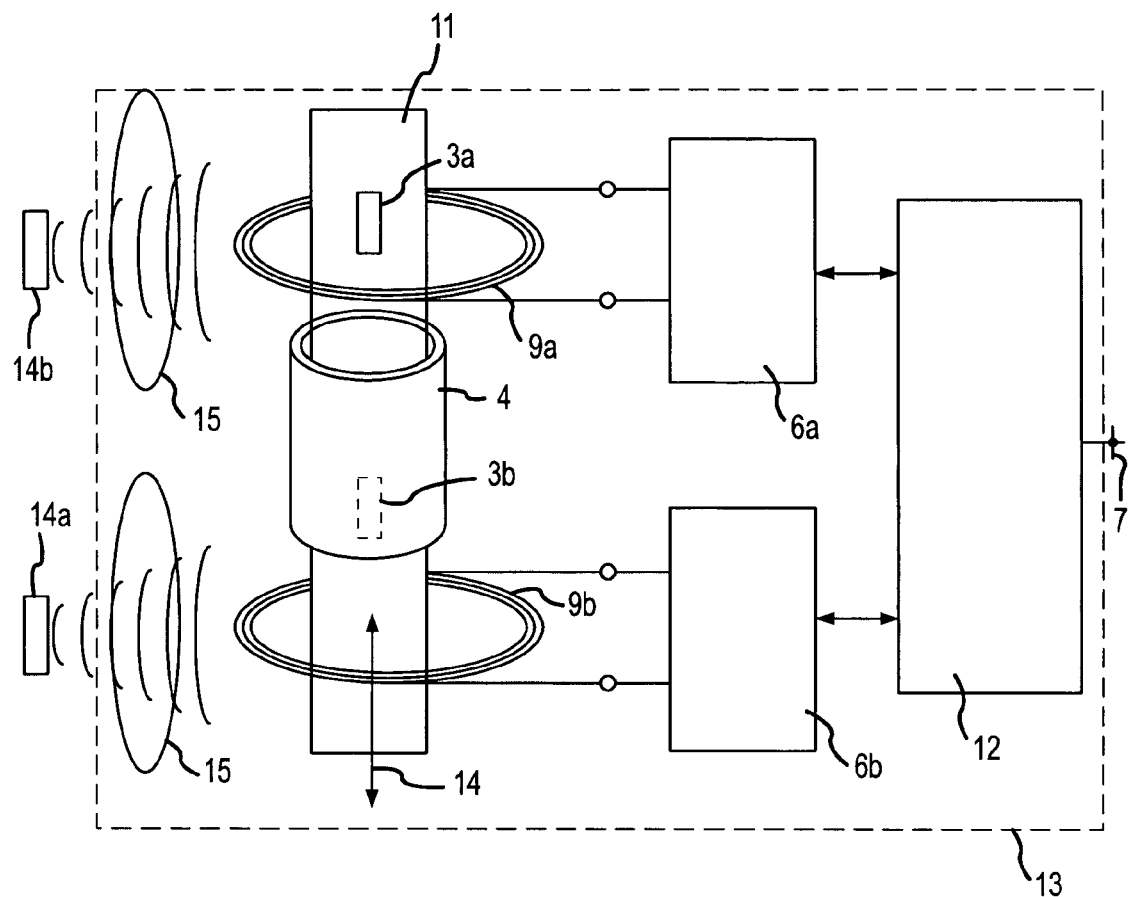
FIG. 2 schematically shows a second exemplary embodiment of a position monitoring device.

In the case of the embodiment illustrated in FIG. 2, provision is made of two transponders 3a, 3b arranged on a stationary or movable, for instance longitudinally displaceable, part 11 at a distance from one another in the direction of movement. For each of the two transponders 3a, 3b, there is a coil 9a, 9b arranged in a stationary manner in this regard, which coils are in each case connected to a separate transceiver 6a, 6b, which, for their part, are connected to an evaluation logic 12. If appropriate, the coils 9a, 9b may enclose the part 11, as illustrated. The part 11 and a screen 4, for instance a screening sleeve, are movable relative to one another for instance between two end positions, so that the screen 4, in the respective end position, can screen one of the two transponders 3a, 3b with respect to its coil 9a or 9b.

The part 11, for instance, a bolt, may be movable in its longitudinal direction in accordance with the arrow 14 for example on a closing part such as a gate, while the screen 4 is arranged on a with regard to the closing part stationary closable part in the form of a wall, fencing or the like with gate or access opening in a machine lining, machine fencing or the like, or is Notionally coupled thereto. In accordance with the relative position of the screen 4 with regard to the respective transponder 3a, 3b, it is thus possible to establish the closed or open state of the closing part. If an echo with a sufficient level does not come from any of the transponders 3a, 3b, the closing part is open. If an echo returns from both transponders 3a, 3b or only from a specific one of the two transponders 3a, 3b, the closed position has not yet been reached. If, by contrast, only the other specific one of the two transponders 3a, 3b responds, the closing part is in the closed state with respect to the part that can be closed off.

What may also be involved in this case, however, is a part e.g. sliding gate, that can be extended or moved with respect to another part, so that it is possible to establish whether the retracted or extended state of the screen-carrying part, for instance, with respect to the part 11 that carries the transponders 3a, 3b is present.

If appropriate, provision may be made of more than two transponders 3a, 3b arranged at a distance relative to one another with associated coils and transceivers in order to detect different states of extension that are determined by the screening of one of the transponders by the screen.

The part 11 may also be formed as a plunger of a contactless position switch in a manner displaceable in the housing 13 thereof in a manner coupled to a part that is movable relative to the housing 13.

If appropriate, a further transponder 14a, 14b may also be provided in a manner arranged in stationary fashion with respect to each of the at least two coils 9a, 9b, which further transponder can be addressed by the respective coil 9a, 9b in order thus to be able to test the functionality of the position monitoring device.

If a plurality of position switches are provided, the respective housing 13 may be provided with at least one window 15, while at least one additional transponder 14a, 14b is arranged on the part to which the housing 13 is fixed, which transponder can be permanently detected by a corresponding coil 9a, 9b in order to supply a corresponding address for the respective position switch in order to be able to distinguish between signals of position switches situated at different locations on the bus 7. The abovementioned possibility of testing for functionality is afforded if a respective transponder 14a, 14b is present for a respective coil 9a, 9b.

Figure 3:
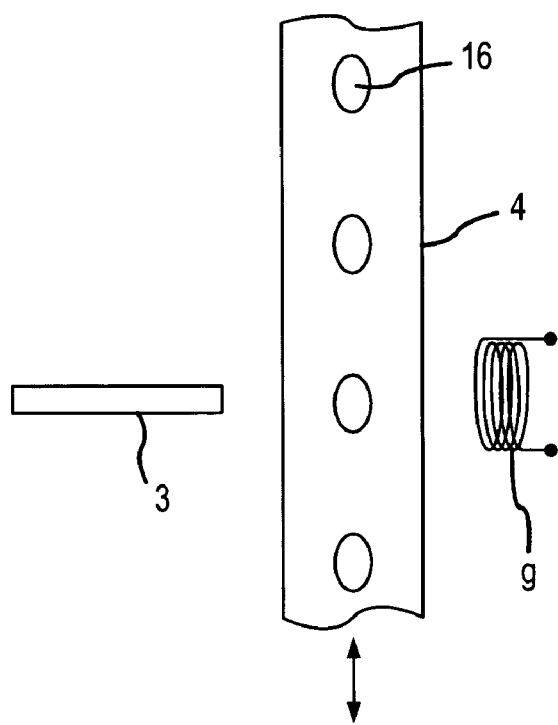
FIG. 3 schematically shows a third exemplary embodiment of a position monitoring device.

In the case of the embodiment of FIG. 3 the screen 4 consists of a sheet strip provided with equidistant holes 16 and is fastened at the moving part 1, whereby the transponder 3 and the transceiver 5 are stationary with respect to part 1 and thus to screen 4. Thus, a kind of an electromagnetic "light barrier" by which for instance the rotational or longitudinal speed of part 1 with respect to part 2 can be determined according to the time distance of detecting the transponder 3 between the interruptions provided by the screen 4.

Figure 4:
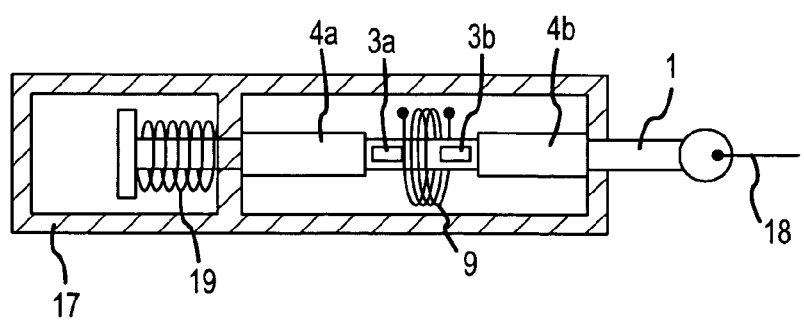
FIG. 4 schematically shows a fourth exemplary embodiment of a position monitoring device in the form of a cable line switch.

In the case of the embodiment of FIG. 4 in the form of a cable line switch, part 1 in the form of a plunger provided with two transponders 3a, 3b spaced to each other in longitudinal direction of part 1 is guided within a housing 17, extends to the outside of the housing 17 and is provided with a cable line 18 which normally is in tension. Two screens 4a, 4b which may be sleeve-like and are able to screen the transponders 3a, 3b against the coil 9 of the transceiver 5 are provided. Part 1 is biased by a spring 19 with respect to the housing 17 in the direction against the tension of the cable line 18. The cable line 18 holds part 1 in a starting position which is a medium position between the transponders 3a, 3b and thus between the screens 4a, 4b so that both transponders 3a, 3b are in the reading area of the coil 9. In the case the cable line 18 is actuated, i.e. is pulled, the transponder 3b reaches the area of the screen 4b and is thus no more detectable by the coil 9. This provides the release of a corresponding signal via the coil 9. In the case the cable line 18 ruptures so that the cable line switch is out of order, the spring 19 pushes part 1 in a position wherein the transponder 3a reaches the area of the screen 4a so that the transponder 3a is no more detectable by the coil 9. Because of the transponder codes thus a failure of the switch is detectable and a corresponding disorder signal can be produced.

It is also possible to use transponders 3 connectable to electronic (digital or analog) transmitters. The transponder 3 can then submit switching conditions and measuring values via his response signal. This may be used in the case information and measuring values of rotating parts 1 have to be transmitted to stationary parts 2.

Instead of a metallic screen 4 it is possible to use one out of a ferromagnetic plastic material or the like.

The screen 4 does not need to be sleeve-like, but can also have any geometric form, for instance it can be plate- or spheresurface-like.

While the invention has been shown and described with reference to preferred embodiments, it should be apparent to one of ordinary skill in the art that many changes and modifications may be made without departing from the spirit and scope of the invention as defined in the claims.

What is claimed is:

1. A position monitoring device for establishing the position of a first part with respect to a second part, the position monitoring device comprising:
   a transceiver being provided at the first part,
   a transponder being provided at the second part,
   the transceiver for emitting an interrogation signal and for receiving a response signal that can be emitted in reaction to the interrogation signal by the transponder,
   a screen which is adapted to attenuate signals between the transponder and the transceiver corresponding to the relative position of the transceiver at the first part, the transponder at the second part and the screen,
   wherein two members of the group consisting of the transceiver, the second part and the first part are movable relative to one another,
   and wherein via the screen a limiting distance between the first and second part is adjustable.

2. The device according to claim 1, wherein the screen is movable relatively to the transponder.

3. The device according to claim 1, wherein the screen is positionable in a relative manner with regard to the second part carrying the transponder between positions having a different screening strength.

4. The device according to claim 3, wherein via the screen a limiting disalignment between the first and second part is adjustable.

5. The device according to claim 3, wherein via the screen a detection time interval of the transponder within the detection area of the transceiver is adjustable.

6. The device according to claim 3, wherein the screen in a position with a higher screening strength screening at least one larger section of the transponder or of the transceiver and defining a shorter position limiting distance than in a position with a lower screening strength.

7. The device according to claim 1, wherein the screen can be fixed with regard to the part carrying the transponder or the transceiver in at least two positions.

8. The device according to claim 7, wherein the screen is movable in a relative manner with regard to the second part carrying the transponder between two end positions.

9. The device according to claim 1, wherein it is formed as a contactless position switch with a housing that receives the second part carrying the transponder and the screen in a movable manner relative to one another.

10. The device according to claim 1, wherein the transponder-carrying second part is a plunger.

11. The device according to claim 1, wherein the screen is a sleeve which is relatively movable to the transponder.

12. The device according to claim 1, wherein the transceiver has an opening for the transponder.

13. The device according to claim 1, wherein provision is made of at least two transponders on the transponder-carrying second part which are detectable via at least one transceiver connected with an evaluation logic.

14. The device according to claim 13, wherein at least one additional transponder is provided for identifying the device.

15. The device according to claim 13, wherein a separate relatively stationary transceiver for each transponder.

16. The device according to claim 13, wherein two transponders being detectable in a middle position by a transceiver and being transportable by the second part in a position shifted to one or other side of the middle position in which shifted positions one of the two transponders is screened by a screen against the transceiver.

* * * * *